United States Patent [19]

Krzanich

[11] Patent Number: 4,790,920

[45] Date of Patent: Dec. 13, 1988

[54] METHOD FOR DEPOSITING AN AL$_2$O$_3$ CAP LAYER ON AN INTEGRATED CIRCUIT SUBSTRATE

[75] Inventor: Brian M. Krzanich, Placitas, N. Mex.

[73] Assignee: Intel Corporation, Santa Clara, Calif.

[21] Appl. No.: 4,784

[22] Filed: Jan. 8, 1987

Related U.S. Application Data

[63] Continuation of Ser. No. 810,847, Dec. 20, 1985, abandoned, which is a continuation of Ser. No. 584,642, Feb. 29, 1984, abandoned.

[51] Int. Cl.$^4$ .............................................. C23C 14/36
[52] U.S. Cl. .......................... 204/192.17; 204/192.22; 437/228
[58] Field of Search ...................... 204/192.15, 192.17, 204/192.22, 192 C, 192 O, 192 SP; 437/194, 199, 228

[56] References Cited

U.S. PATENT DOCUMENTS

| | | | |
|---|---|---|---|
| 3,350,222 | 10/1967 | Ames et al. | 204/192 D X |
| 3,355,371 | 11/1967 | Hile et al. | 204/164 |
| 4,302,498 | 11/1981 | Faith, Jr. | 428/209 |
| 4,433,004 | 2/1984 | Yonezawa et al. | 427/38 |

OTHER PUBLICATIONS

L. I. Maissel and R. Glang, *Handbook of Thin Film Technology*, McGraw-Hill Book Co., New York, 1970, pp. 4-26 to 4-29.

*Primary Examiner*—John F. Niebling
*Assistant Examiner*—William T. Leader
*Attorney, Agent, or Firm*—Blakely, Sokoloff, Taylor & Zafman

[57] ABSTRACT

A process for depositing a layer of reactively sputtered aluminum oxide on a wafer is disclosed, having particular application in semiconductor fabrication. A wafer is provided with a layer of aluminum (or aluminum with 1% silicon) having a thickness of generally one micron, using common semiconductor fabrication techniques. The wafer with its aluminum layer is disposed within a vacuum chamber which has been evacuated. An argon sputtering gas is introduced into the chamber along with oxygen, such that aluminum oxide is formed in the plasma region and deposited on the aluminum layer. Using this technique, a 300 angstroms aluminum oxide layer is deposited over the existing aluminum layer on the wafer, thereby forming an aluminum oxide cap layer. The presence of the aluminum oxide cap layer has been found to significantly reduce the formation of mouse bites and notches, as well as initial film stress during fabrication.

11 Claims, 3 Drawing Sheets

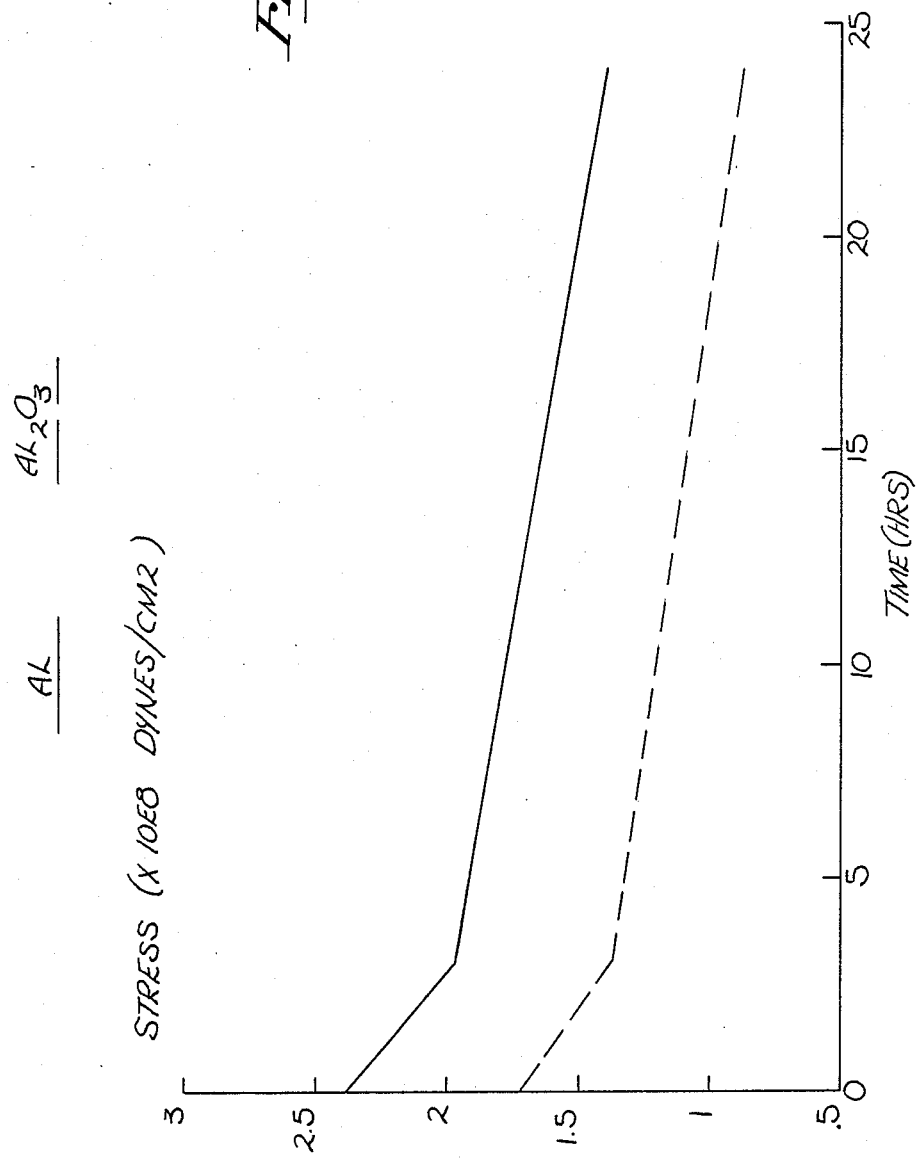

METHOD FOR DEPOSITING AN AL$_2$O$_3$ CAP LAYER ON AN INTEGRATED CIRCUIT SUBSTRATE

This application is a continuation of application Ser. No. 810,847 filed 12/20/85 now abandoned which is a continuation of application Ser. No. 584,642 filed 2/29/84 abandoned.

BACKGROUND OF THE INVENTION

1. Field of the Invention

The present invention relates to the field of semiconductor fabrication, and more particularly, to the deposition of aluminum oxide on an integrated circuit wafer.

2. Art Background

During the fabrication of an integrated circuit on a substrate ("wafer"), it is common for "mouse bites" and "notches" to be formed during the etching process. Mouse bites and notches occur where the deposited aluminum layer on a wafer is etched away from a metal lead in an area where the aluminum was to cover the lead completely. The etching away of aluminum from the metal lead may result in the formation of an integrated circuit which is subject to shorting or intermittent malfunction.

As will be described, the present invention provides a cap layer of aluminum oxide over a previously deposited aluminum layer such that during photolithography, the formation of mouse bites and notches during the etching process are precluded. In addition, the present invention has been found to increase the absorption of light during the photolithographic process, thereby increasing the efficiency of the photolithographic techniques.

SUMMARY OF THE INVENTION

A process for depositing a layer of reactively sputtered aluminum oxide on a wafer is disclosed, having particular application in semiconductor fabrication. A wafer is provided with a layer of aluminum (or aluminum with 1% silicon) having a thickness of generally one micron, using common semiconductor fabrication techniques. The wafer with its aluminum layer is disposed within a vacuum chamber which has been evacuated. An argon sputtering gas is introduced into the chamber along with oxygen, such that aluminum oxide is formed in the plasma region and deposited on the aluminum layer. Using this technique, one micron aluminum oxide layer is deposited over the existing aluminum layer on the wafer, thereby forming an aluminum oxide cap layer. The presence of aluminum oxide cap layer has been found to significantly reduce the formation of mouse bites and notches, as well as initial film stress during fabrication.

BRIEF DESCRIPTION OF THE DRAWINGS

FIG. 4 is a graph illustrating stress vs. time for a standard Al/Si film and an Al/Si film with a 300 angstrom Al$_2$O$_3$ cap layer.

DETAILED DESCRIPTION OF THE INVENTION

A process for providing an aluminum oxide "cap" layer over a previously deposited aluminum layer on a wafer is disclosed, having particular application in semiconductor fabrication. In the following description for purposes of explanation, specific numbers, percentages, concentrations, thicknesses, pressures, etc., are set forth in order to provide a thorough understanding of the present invention. However, it will be apparent to one skilled in the art that the present invention may be practiced without these specific details. In other instances, well known processes are shown in block diagram form in order not to obscure the present invention unnecessarily.

Figure 1:
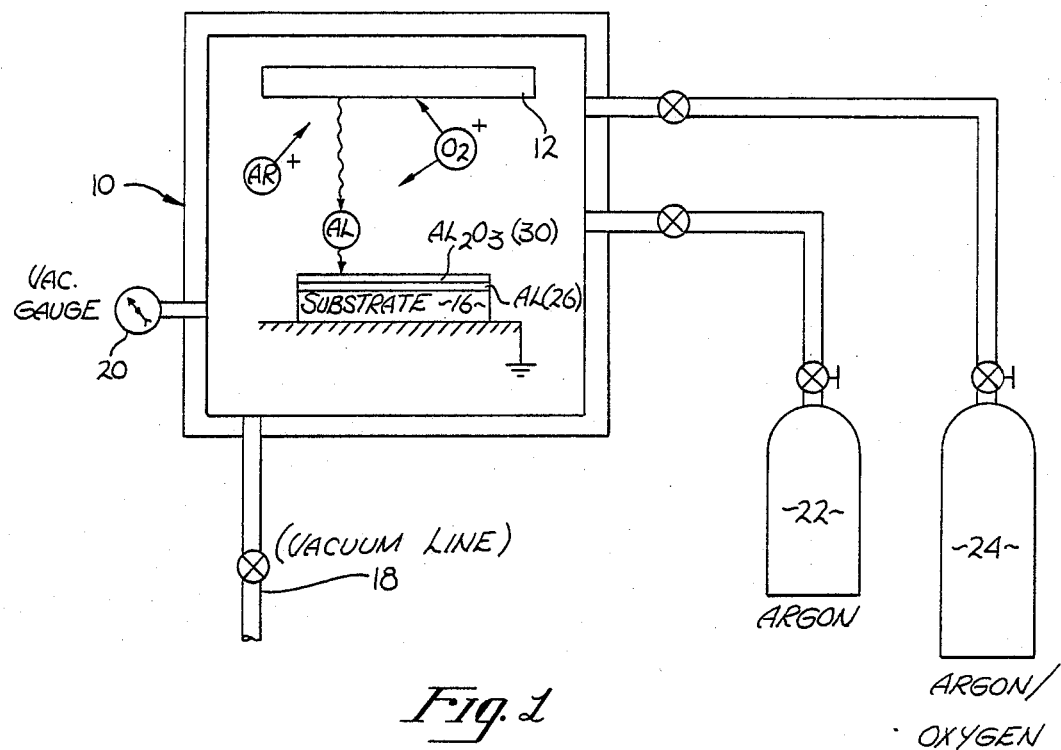
FIG. 1 is a schematic of one form of vacuum deposition apparatus useful in practicing the invention.

Referring now to FIG. 1, the apparatus illustrated typically represents one of many sputtering deposition systems used in the art for semiconductor fabrication. A vacuum chamber 10 is provided, with a conventional source 12 of aluminum suitably positioned within the chamber. Suitable sources of aluminum include any of the known boats, strips, crucibles, coils or sputtering targets suitably energized to provide an aluminum atom flux to the substrates. Substrate 16 is a thermally oxidized silicon "wafer" with contact openings or cuts formed therein for access to the surface of the silicon material to which conductive contacts are to be made. Substrate 16 is disposed on a substrate holding fixture which in the present embodiment may be grounded. A suitable source of power, not shown, is provided to the apparatus as required to generate the flux or stream of aluminum atoms, or compositions thereof, from the source 12.

Chamber 10 is evacuated through vacuum line 18, and the pressure within the chamber 10 may be monitored using vacuum guage 20. In the present invention, an argon source 22 is provided with appropriate valves and tubing such that argon may be selectively introduced into chamber 10. Similarly, an argon/oxygen source 24 is also provided with the necessary coupling apparatus in order to selectively introduce argon/oxygen mixtures into chamber 10 in accordance with the teachings of the present invention.

Figure 3:
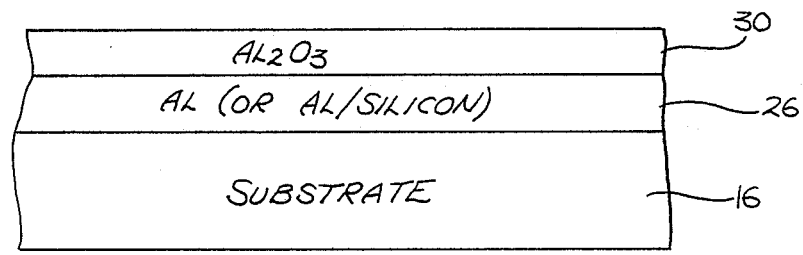
FIG. 3 is a cross-sectional view of a semiconductor device including the aluminum oxide "cap" layer of the present invention.
Figure 2:
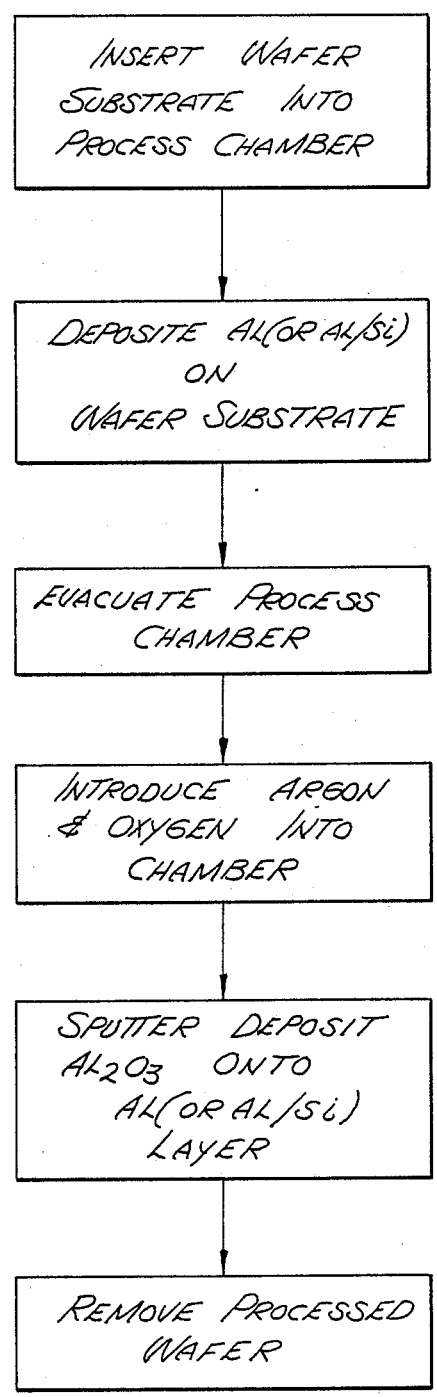
FIG. 2 is a block diagram symbolically illustrating the sequence of steps which are utilized by the present invention.

As illustrated in FIGS. 1 through 3, substrate wafer 16 is introduced into chamber 10 wherein a layer of aluminum 26 is deposited on substrate 16, using techniques well known in the art. In operation, aluminum atoms are provided from source 12 and deposited on the exposed surfaces of substrate 16 until the desired aluminum thickness layer is achieved. Presently, aluminum layer 26 is approximately one micron in thickness, and in addition, in some instances, aluminum layer 26 includes approximately 1% silicon depending on the particular type of integrated circuit to be formed. In the present embodiment, the sputtering gas used to deposit aluminum layer 26 consists of pure (99.999%) argon. The deposition of layer 26 occurs at a pressure of approximately $6 \times 10^{-3}$ Torr., with a resulting deposit rate of 1400 Å/min. using a power setting of 8.5 Kw.

In accordance with the teachings of the present invention, once aluminum layer 26 is deposited on substrate 16 chamber 10 is evacuated down to the mid $10^{-7}$ Torr. range. After reaching this set point, a gas mixture of 94% argon and 6% oxygen from source 24 is introduced into chamber 10 at a pressure of $1 \times 10^{-2}$ Torr. using a power seting of 2.5 Kw. Aluminum oxide (Al$_2$O$_3$) is formed in the plasma when aluminum atoms from target 12 react with energetic oxygen molecules introduced from source 24. A resulting aluminum oxide layer 30 forms on the surface of aluminum layer 26 at a rate of approximately 115 Å/min. This "cap" layer in the present embodiment comprises a 300 Angstrom (Å) layer of aluminum oxide. The deposited layers are then annealed at 460° to 520° C. using well known techniques.

It has been found that the use of a 300 Å cap layer of aluminum oxide over the one micron aluminum layer 26 having 1% silicon results in a 98% reduction in the formation of mouse bites and notches, and a 20% reduction in initial film stress. As illustrated in FIG. 4, the use of an aluminum oxide cap layer significantly reduces film stress. Data used to generate the graph of FIG. 4 was obtained after a 460° C. ambient annealing process. In addition, it has been found that the use of cap layer 30 results in an increased absorption of light in wavelengths from 406 to 436 nanometers. The 300 Å cap layer of aluminum oxide presents an improved surface for polymer resists adhesion during photolithography, and helps to fill in gaps between larger aluminum grains preventing acids from working their way under the resist and etching away metal thereby forming mouse bites.

Accordingly, the present invention's use of aluminum oxide as a cap layer significantly improves the yield during semiconductor fabrication, and provides advantages not known in the prior art.

I claim:

1. A method for fabricating an integrated circuit wafer, comprising the steps of:
    (a) positioning a thermally oxidized silicon wafer on a substrate holding fixture in a vacuum chamber;
    (b) evacuating said vacuum chamber;
    (c) introducing argon gas into said vacuum chamber until a first sputtering pressure of about $6 \times 10^{-3}$ TORR. is attained;
    (d) depositing an aluminum layer on said silicon wafer by sputtering an aluminum target at said first sputtering pressure until said aluminum layer reaches a thickness of about 1 micron;
    (e) evacuating said vacuum chamber to a pressure in the mid $10^{-7}$ TORR. range;
    (f) introducing a gas mixture of argon and oxygen into said vacuum chamber until a second sputtering pressure of about $1 \times 10^{-2}$ TORR. is reached;
    (g) depositing an aluminum oxide layer on said aluminum layer by sputtering said aluminum target at said second sputtering pressure until said aluminum oxide layer attains a thickness of about 300 Angstroms;
    (h) providing a desired resist pattern on said aluminum oxide layer;
    (i) etching said aluminum and aluminum oxide layers whereby said aluminum oxide layer prevents etching acids from forming mouse bites or notches in said aluminum layer; and
    (j) annealing said semi-conductor chip whereby said aluminum oxide layer manifests reduced film stress after heating.

2. The method of claim 1, wherein said annealing temperature is between 460° C. and 520° C.

3. The method of claim 1, whereby initial film stress is reduced by 20%.

4. The method of claim 1, wherein said resist is photolithographically patterned on said aluminum oxide layer.

5. The method of claim 4, wherein said aluminum oxide layer provides increased absorption of light during said photolithographic patterning.

6. The method of claim 1, wherein deposition of said aluminum layer occurs at a rate of 1400 Å/min. using a power setting of 8.5 Kw.

7. The method of claim 1, wherein deposition of said aluminim oxide layer occurs at a rate of 115 Å/min. using a power setting of 2.5 Kw.

8. The method of claim 1, wherein said aluminum oxide layer is formed in the presence of 94% argon gas and 6% oxygen gas.

9. A method for fabricating an integrated circuit wafer in order to reduce film stress, the formation of mouse bites and notches during an etching step and to increase light absorption during a patterning step, said method comprising the steps of:
    positioning a thermally oxidized silicon wafer on a substrate holding fixture in a vacuum chamber;
    introducing argon gas into said vacuum chamber until a first sputtering pressure of about $6 \times 10^{-3}$ TORR. is attained;
    depositing a layer of aluminum on said substrate by sputtering with argon gas at said first sputtering pressure until said aluminum layer reaches a thickness of about 1 micron;
    depositing a layer of aluminum oxide on said aluminum layer by sputtering with an argon-oxygen gas mixture at a second pressure of about $1 \times 10^{-2}$ TORR. until said aluminum oxide layer attains a thickness of about 300 Angstroms;
    photolithographically patterning a resist such that said aluminum oxide layer provides increased absorption of light during photolithography;
    etching said aluminum and aluminum oxide layers, whereby said aluminum oxide layer reduces formation of mouse bites and notches on said aluminum layer; and
    annealing said semi-conductor chip whereby said aluminum oxide layer manifests reduced film stress.

10. The method of claim 9, wherein said aluminum oxide layer is formed in the presence of 94% argon gas and 6% oxygen gas.

11. A method of forming a cap layer of aluminum oxide on an aluminum layer on a substrate for reducing film stress and the number of mouse bites and notches in said aluminum layer, comprising the steps of:
    depositing about a 1 micron thick layer of aluminum on said substrate, using an argon sputtering gas at a first pressure of about $6 \times 10^{-3}$ TORR. wherein deposition of said aluminum layer occurs at a rate of 1400 Å/min. using a power setting of 8.5 Kw;
    depositing about a 300 Angstrom thick layer of aluminum oxide on said aluminum layer by sputtering aluminum in the presence of argon and oxygen gas at a second pressure of about $1 \times 10^{-2}$ TORR., wherein deposition of said aluminum oxide layer occurs at a rate of 115 Å/min. using a power setting of 2.5 Kw;
    photolithographically patterning a resist such that said aluminum oxide layer provides increased absorption of light during patterning; and
    etching said layers wherein said aluminum oxide layer reduces formation of mouse bites and notches in said aluminum layer.

* * * * *